(12) United States Patent
Peng et al.

(10) Patent No.: US 8,084,319 B2
(45) Date of Patent: Dec. 27, 2011

(54) PRECISELY TUNING FEATURE SIZES ON HARD MASKS VIA PLASMA TREATMENT

(75) Inventors: Hongbo Peng, Yorktown Heights, NY (US); Stephen M. Rossnagel, Yorktown Heights, NY (US); Katherine L. Saenger, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/704,665

(22) Filed: Feb. 12, 2010

(65) Prior Publication Data

US 2011/0201204 A1 Aug. 18, 2011

(51) Int. Cl.
*H01L 21/8238* (2006.01)
(52) U.S. Cl. ........................................ 438/223
(58) Field of Classification Search ............... None
See application file for complete search history.

(56) References Cited

U.S. PATENT DOCUMENTS

| | | | |
|---|---|---|---|
| 4,576,829 A | 3/1986 | Kaganowicz et al. | |
| 4,692,992 A * | 9/1987 | Hsu ........................ | 438/223 |
| 6,180,490 B1 * | 1/2001 | Vassiliev et al. ............ | 438/424 |
| 6,217,872 B1 | 4/2001 | Okayama et al. | |
| 6,727,174 B1 | 4/2004 | Kotecki et al. | |
| 6,777,260 B1 | 8/2004 | Chen | |
| 6,962,849 B1 | 11/2005 | Kamal et al. | |
| 7,351,648 B2 | 4/2008 | Furukawa et al. | |
| 7,468,271 B2 | 12/2008 | Golovchenko et al. | |
| 7,553,730 B2 | 6/2009 | Barth et al. | |
| 7,560,141 B1 | 7/2009 | Kim et al. | |
| 2005/0101100 A1 * | 5/2005 | Kretchmer et al. ........... | 438/424 |
| 2006/0105553 A1 * | 5/2006 | Wellhausen .................. | 438/526 |
| 2007/0020146 A1 | 1/2007 | Young et al. | |
| 2007/0042366 A1 | 2/2007 | Ling | |
| 2007/0138132 A1 | 6/2007 | Barth | |
| 2008/0102504 A1 | 5/2008 | Akeson et al. | |
| 2009/0136958 A1 | 5/2009 | Gershow et al. | |
| 2009/0222216 A1 | 9/2009 | Hibbs et al. | |
| 2010/0025249 A1 | 2/2010 | Polonsky et al. | |

(Continued)

OTHER PUBLICATIONS

A. J. Storm et al., "Fabrication of solid-state nanopores with single-nanometre precision," Nature Materials, vol. 2, Aug. 2003, pp. 537-540.

(Continued)

*Primary Examiner* — Charles Garber
*Assistant Examiner* — Andre' C Stevenson
(74) *Attorney, Agent, or Firm* — Cantor Colburn LLP; Vazken Alexanian (57) ABSTRACT

Methods are provided for fabricating devices. A first layer is formed. A hardmask on the first layer is formed. Features on the hardmask are patterned. The sizes of features on the hardmask are reduced by applying a plasma treatment process to form reduced size features. Also, the size of features on the hardmask can be enlarged to form enlarged size features by applying the plasma treatment process and/or removing the oxidized part of the feature during plasma treatment process. Another method may include a first layer formed on a substrate and a second layer formed on the first layer. First features are patterned on the first layer, and second features are patterned on the second layer. A size of second features on the second layer is closed due to the different oxidation rate of the two layers during the plasma treatment process, to form a self-sealed channel and/or self-buried trench.

21 Claims, 9 Drawing Sheets

U.S. PATENT DOCUMENTS

2010/0084276 A1 4/2010 Lindsay
2010/0327255 A1 12/2010 Peng et al.

OTHER PUBLICATIONS

D. W. Hess, "Plasma-assisted oxidation, anodization, and nitridation of silicon," IBM J. Res. Develop. vol. 43. No. 1/2, Jan./Mar. 1999, pp. 127-145.

M. J. Kim et al., "Rapid Fabrication of Uniformly Sized Nanopores and Nanopore Arrays for Parallel DNA Analysis," Adv. Mater. 2006, 18, pp. 3149-3153.

Douville, et al., "DNA Linearization Through Confinement in Nanofluidic Channels, Anal Bioanal Chem.", Aug. 2008; vol. 391; No. 7; pp. 2395-2409; Abstract; p. 2402, col. 2; para 5; p. 2406; col. 2; para 2; p. 2407; Fig. 5b.

International Search Report—PCT; Notification of Transmittal of the International Search Report and the Written Opinion of the International Searching Authority, or the Declaration; Apr. 5, 2011; International application No. PCT/US1123872.

Written Opinion of the International Searching Authority; date of mailing Apr. 5, 2011; pp. 1-6; International application No. PCT/US11/23872.

* cited by examiner

PRECISELY TUNING FEATURE SIZES ON HARD MASKS VIA PLASMA TREATMENT

BACKGROUND

Exemplary embodiments relate to semiconductor processing, and more specifically, to precisely tuning sizes of existing features on hardmasks.

Lithography is widely used to pattern layers in semiconductor processing. A particularly useful application of lithography relates to the production of contact holes. As dimensions shrink in semiconductor devices, forming contact holes becomes increasingly difficult. With current technology, reliably defining contact holes with reproducible size is a major hurdle for semiconductor manufacturing. Building very-reproducible sub-minimum-lithography-dimensioned "holes" or trenches/troughs is desirable.

Methods for producing sub-minimum-lithography-dimensioned contact holes or any other sub-minimum-lithography-dimensioned features typically involve the use of optical lithography to print minimum-lithography-dimensioned holes which can then be shrunk to necessary (sub-minimum-lithography) dimensions by forming spacer layers on the hole sidewalls.

BRIEF SUMMARY

According to one exemplary embodiment, a method for fabricating a device is provided. A first layer is formed. A hardmask on the first layer is formed. Features (such as vias) are transferred into the hardmask. The sizes of the features on the hardmask are reduced by applying a plasma treatment process to form reduced size features.

According to another exemplary embodiment, a method for fabricating a device is provided. A first layer is formed. A hardmask is formed on the first layer. Features (such as vias) are transferred into the hardmask. The sizes of the features on the hardmask are enlarged to form enlarged size features by applying a plasma treatment process.

According to one exemplary embodiment, a method for fabricating a device comprising one or more enclosed channels is provided. A first layer is formed. A second layer is formed on the first layer and a hardmask is formed on the second layer. Patterned features (such as trenches) are transferred into the second layer and hardmask. A size of the features is closed on the hardmask by applying a plasma treatment process.

Additional features are realized through the techniques of the present invention. Other systems, methods, apparatuses, and/or devices according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

DETAILED DESCRIPTION

The resolution of photolithography is limited to about 100 nm by the wavelength of the light used in the process. To form sub-50 nm features, sub-minimum-lithography methods, such as spacer technology, are needed to shrink the features, for example, by conformally coating the feature's horizontal (top and bottom) and vertical (sidewall) surfaces and then etching the coatings on the horizontal surfaces.

Exemplary embodiments of the present disclosure provide an integrated circuit (IC) compatible method for precisely tuning the sizes of pre-existing features in a hard mask, made by either photolithography or sub-lithographic methods, within single nanometer resolution. For example, the technique of exemplary embodiments can shrink holes from 20 nm down to sub-5 nm and even to zero nm, in which case the hole (feature) completely closes.

Exemplary embodiments also provide methods for feature size tuning in hardmasks comprising layers of different materials. In contrast to conventional deposited spacer technology, the present methods of feature size tuning allows the feature sizes in each layer of the hardmask to be tuned individually.

FIGS. 1A, 1B, 1C, 1D, 1E, 1F, 1G, 1H, and 1I illustrate a block diagram of a cross-section view of a layer stack 100 in accordance with exemplary embodiments. FIGS. 1A, 1B, 1C, 1D, 1E, 1F, 1G, 1H, and 1I (which may be referred to generally as FIG. 1) illustrate the concept of fine-tuning feature size via plasma treatment according to exemplary embodiments.

Figure 1A:
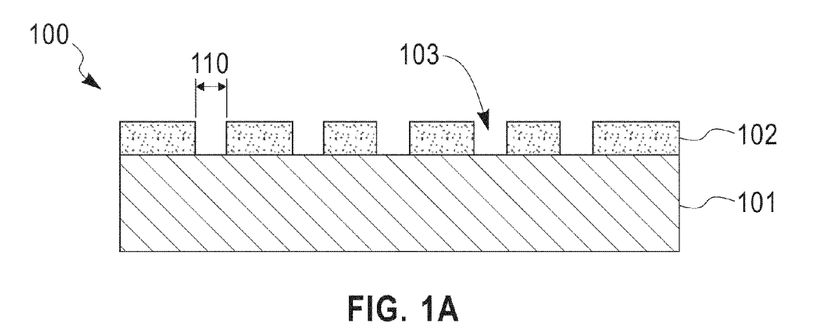
FIGS. 1A, 1B, 1C, 1D, 1E, 1F, 1G, 1H, and 1I illustrate a block diagram of a cross-section view of a layer stack in accordance with exemplary embodiments.

The layer stack 100 includes a substrate 101 and a hardmask layer 102 comprising a layer of solid material on top of the substrate 101. The substrate 101 may be any material (such as silicon nitride) that will not be oxidized by, e.g., $O_2$ plasma (or other plasmas as known in the art for oxidation). Also, if the substrate 101 is a material that can be oxidized by, e.g., $O_2$ plasma, the substrate 101 may include a top layer (not shown) that will not be oxidized by $O_2$ plasma, and the top layer (formed between the substrate 101 and the hardmask 102) would cover the (entire) top surface of the substrate 101.

As understood by one skilled in the art, a hardmask is a material used in semiconductor processing as an etch mask in lieu of a polymer or other soft material. For example, polymers tend to be etched easily by oxygen, fluorine, chlorine, or other reactive gases to the extent that a pattern defined using a polymeric mask is rapidly degraded during plasma etching. In one example, hardmask layer 102 comprises silicon.

The feature shapes 103 are the original features patterned in the hardmask 102 by, for example, photolithography and/or sub-minimum-lithography methods understood by one skilled in the art. For example, the feature shapes 103 (as well as the features shapes 304 and 403 in FIGS. 3 and 4 respectively) patterned in the hardmask 102 may be formed utilizing a conventional method and/or utilizing techniques described in U.S. Pat. No. 7,351,648 entitled "Methods For Forming Uniform Lithographic Features" which is herein incorporated by reference. The feature shapes 103 may include holes, trenches, vias, channels, pores, etc. In other words, the features shapes 103 could be any shape desired. When the hardmask 102 is subjected to plasma treatment, two possible effects could happen on the surface and the walls of the features:

(1) There would be a chemical reaction between the species in the plasma (ions, radicals, atoms, and/or molecules) and the materials of the hardmask 102. Depending on the molecular density of the resulting product, the feature 103 could either enlarge and/or shrink according to exemplary embodiments.

(2) The physical bombardment of plasma species on the surfaces and walls of the features 103 could induce material migration and/or removal, which can also change the sizes of the features.

Figure 1B:
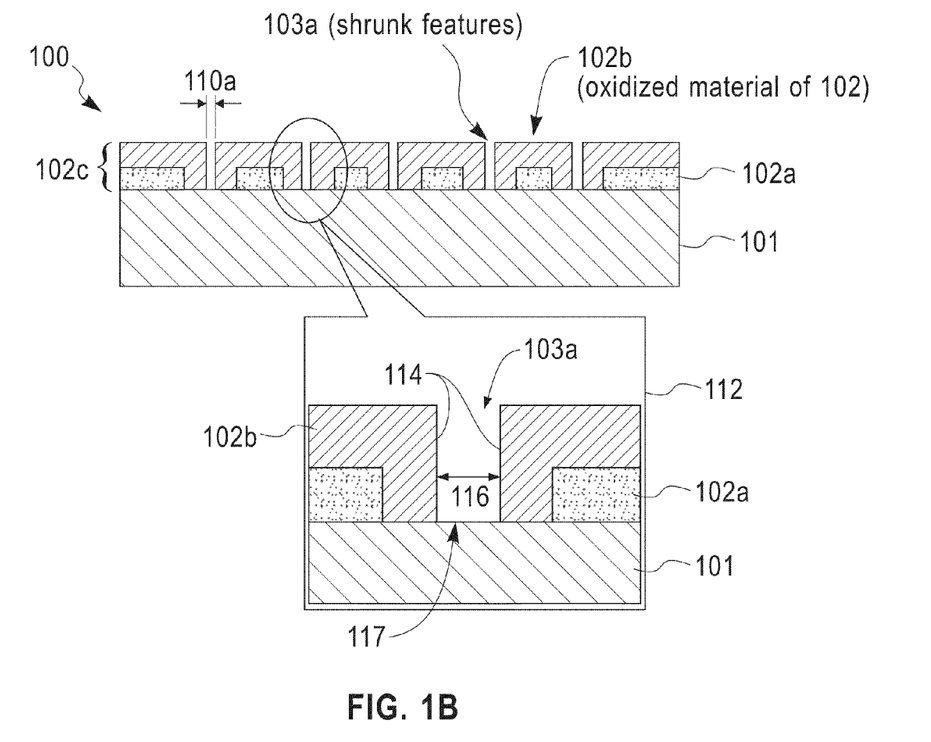

For explanation purposes, at times the features shapes 103 and 104 may be referred to as holes, but it is understood that the features shapes 103 and 104 are not meant to be limiting and may include numerous shapes such as trenches, channels, pores, vias, etc. With reference to FIG. 1B, the hole 103a shows the shrunk feature of 103 after the plasma treatment process. In FIG. 1A, the original hole 103 (which is now the reduced in size hole 103a) was larger than the shrunk hole 103a in FIG. 1B. In accordance with exemplary embodiments, the plasma treatment process has caused the hardmask 102 to oxidize, and the oxidized material 102b of the hardmask 102 is shown in FIG. 1B.

The remainder of the hardmask 102 that is not oxidized is illustrated as non-oxidized material 102a in FIG. 1B. For ease of understanding, the oxidized portion of the hardmask 102b and non-oxidized portion of the hardmask 102a are now collectively referred to as the hardmask 102c. The oxidized material 102b includes both the material of the hardmask 102 and (oxygen) molecules of the plasma gas utilized for plasma treatment. Since some of the material of the hardmask 102 was utilized in the oxidation process to combine with the oxygen molecules of the plasma gas, the non-oxidized material 102a is smaller than the original hardmask material 102.

Since the oxidized material 102b is grown on (from) the hardmask material 102 during plasma treatment and if the molecular density of the oxidized material 102b is lower than that of 102, the hole 103 shrinks to the size of the hole 103a, and the oxidation process of the plasma treatment results in a smaller original material 102 identified as non-oxidized material 102a. Also, for illustration purposes, a width 110 (e.g., the diameter for the hole 103) of the hole 103 on the hardmask material 102 is shown in FIG. 1A. After applying the plasma treatment process, a width 110a (e.g., the diameter for the hole 103a) is shown after the oxidized material 102b is grown from the hardmask material 102. As seen in FIG. 1B, the width 110a is smaller than the width 110 because the oxidized material 102b encompasses part of the space which originally formed the hole 103 of the hardmask 102. For the sake of conciseness, it is noted that one skilled in the art understands the oxidation process for semiconductors.

Figure 1C:
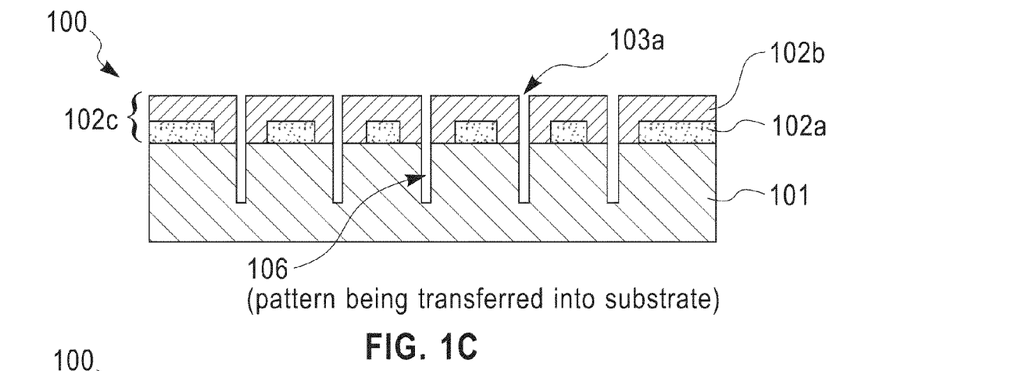

The pattern of the features 103a (formed by the oxidized material 102b and non-oxidized material 102a) can be transferred into the substrate 101 by, e.g., reactive ion etching (RIE) (and/or other etching methods), and the transferred pattern is illustrated as features 106 in FIG. 1C. Also, in exemplary embodiments not shown, RIE can be utilized to transfer the features 103a all the way through the substrate 101 as the transferred features 106. The size of features 103a (resulting in the transferred features 106) can also be finely tuned before the etching step by adjusting the conditions (e.g., substrate temperature, plasma power, etc.) of the plasma treatment process and/or the duration of plasma treatment process. For example, to fine tune the size of the features 103a (resulting in the transferred features 106), the plasma treatment process can be prolonged (extended for a certain period of time) until the desired size is achieved. It is also noted that the thickness and/or growth rate of the oxide material 102b can be well controlled throughout the plasma treatment process, thus allowing for consistency and uniformity in the dimension changes introduced to produce features 103a.

Figure 1D:
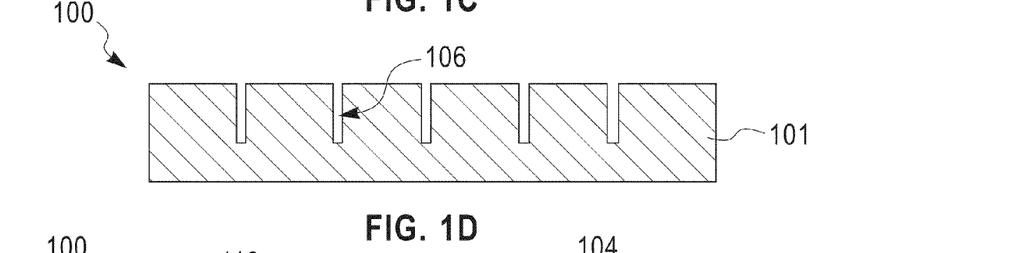

FIG. 1D illustrates an example of the final layer stack 100 only showing the substrate 101 with the transferred features 106 in accordance with exemplary embodiments. In FIG. 1D, the hardmask 102c (which now comprises the non-oxidized material 102a and the oxidized material 102b) has been removed by, e.g., conventional methods as understood by one skilled in the art. For example, when the hardmask 102c comprises $SiO_2$ as layer 102b and Si as layer 102a, and when the substrate 101 comprises SiN, the $SiO_2$ hardmask layer 102b may be selectively removed in an aqueous solution of dilute hydrofluoric acid (dHF) or a buffered oxide etch (BOE) and the Si hardmask layer 102a may be selectively removed in a solution containing tetramethyl ammonium hydroxide (TMAH).

FIGS. 1A through 1D illustrate a full cycle to precisely tune/shrink the features 104 (resulting in the patterned features 106) into and/or through the substrate 101, which can be a substrate that will not be oxidized by the $O_2$ plasma (and/or any substrate 101 with a layer material on top that will not be oxidized by $O_2$ plasma).

As discussed herein, the plasma treatment of the layer stack 100 can be performed until the features 103 decrease (i.e., are tuned) to a desired size (width) according to exemplary embodiments. As will be seen herein, the size of the feature 103 can also be increased as desired. With reference to FIG. 1B, a call out 112 illustrates an enlarged view of the features 103a and it is understood that the figures herein are not drawn to scale. The sidewalls 114 (as well as the height) of the feature 103a formed of the oxidized material 102b can continue to grow during plasma treatment until the sidewalls 114 nearly touch and/or actually touch. For example, as the plasma treatment is repeated (and/or prolonged) the space 116 between the sidewalls 114 continues to decreases (shrink), and if continuously repeated the space 116 between sidewalls 114 will completely disappear thus causing the sidewalls 114 to touch one another (because of the continued new growth of oxidized material 102b) as will be discussed further in the present disclosure. Unlike conventional deposited spacer technology methods that utilize spacers to cover both the sidewalls 114 and the bottom 117, the technique of exemplary embodiments only covers the sidewalls 114, saving the trouble of removing the covering layer at the bottom 117 when transferring the pattern down to the substrate 101 later.

Figure 1E:
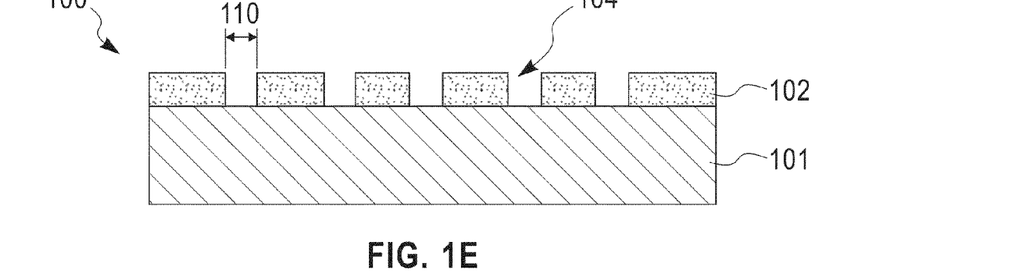
Figure 1F:
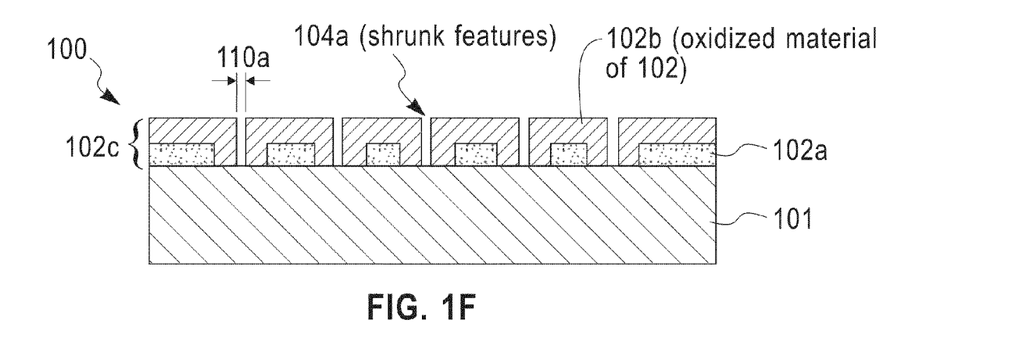

FIGS. 1A-1D have demonstrated tuning the size of the feature 103 in hardmask layer 102 by shrinking the feature 103. In contrast, FIGS. 1E-1I illustrate tuning the size of a feature 104 in hardmask layer 102 by enlarging the feature 104. FIGS. 1E and 1F are similar to FIGS. 1A and 1B. In FIG. 1E, the original feature 104 (which was 103 in FIG. 1A) is patterned in the hardmask 102 in the layer stack 100.

Figure 1G:
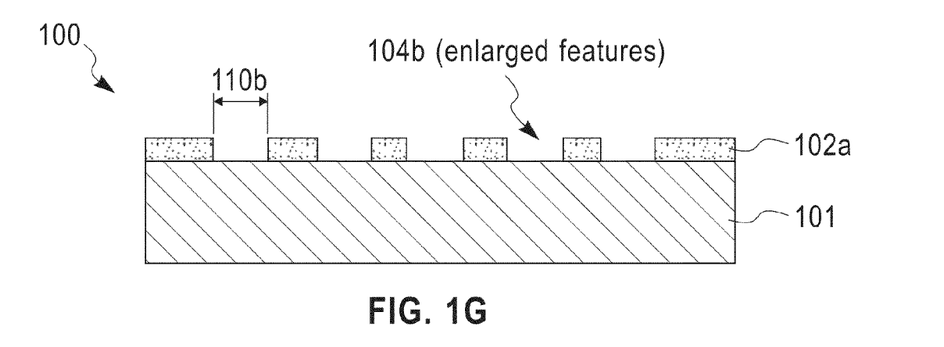

Similar to as discussed above for FIG. 1B, FIG. 1F shows the oxidized material 102b and the non-oxidized material 102a as the hardmask 102c. In FIG. 1G, an etching process (e.g., etching in dHF) is utilized to remove the oxidized material 102b and leave the non-oxidized material 102a on the substrate 101. In FIG. 1G, the removal of the oxidized material 102b leaves an expanded feature (enlarged) 104b. In FIG. 1G, the width 110b of the hole 104b is larger than the width 110 of the hole 104 in FIG. 1E and the width 110a in FIG. 1F. Since part of the non-oxidized material 102a is combined with the O₂ during the plasma treatment to form the oxidized material 102b, when the oxidized material 102b is removed part of the original hardmask 102 is actually being removed, which results in the larger width 110b. Accordingly, since the non-oxidized material 102a is smaller than the original hardmask 102, the expanded feature 104b is larger than the features 104 and 104a.

It is noted that the above-described process of enlarging hardmask features (in FIGS. 1E-1I) by first oxidizing the exposed surface regions of a patterned hardmask layer and then removing the resulting surface oxides may be repeated as many times as necessary to reach the desired degree of feature enlargement.

Figure 1H:
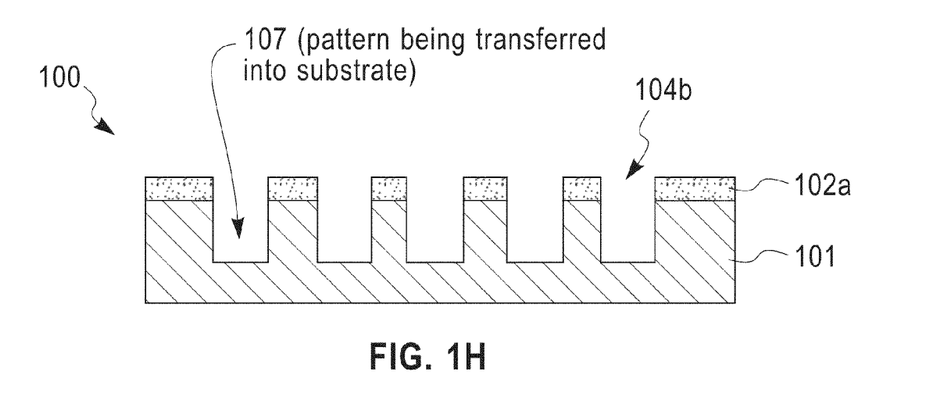

FIG. 1H illustrates a transferred feature 107 formed in the substrate 101 in accordance with exemplary embodiments. For example, RIE may be utilized to transfer the pattern of the feature 104b down to the substrate 101 to form the transferred patterned feature 107. As discussed above, the transferred patterned feature 107 can be transferred all the way through the substrate 101 if desired (not shown). As seen in FIG. 1H, the non-oxidized material 102a becomes the hardmask which protects the substrate 101 underneath, and the exposed part of the substrate 101 is removed during etching as understood by one skilled in the art.

Figure 1I:
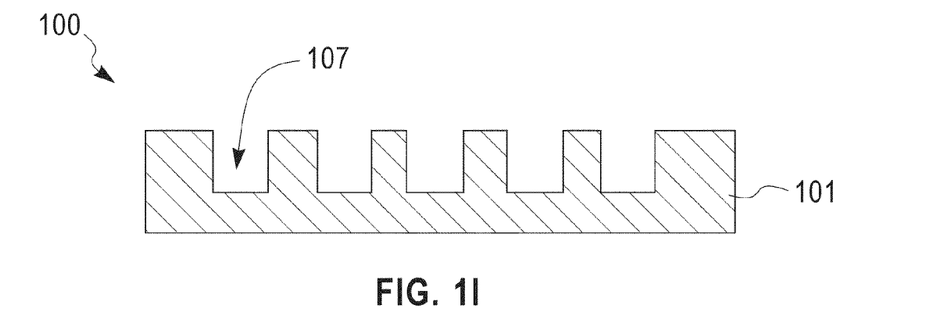

FIG. 1I illustrates the substrate 101 with the non-oxidized material 102a (hardmask) removed in accordance with exemplary embodiments. The non-oxidized material 102a may be removed by conventional methods as understood by one skilled in the art. FIGS. 1E, 1F, 1G, 1H, through 1I illustrate a full cycle to precisely tune the features 104b (resulting in the transferred features 107) into and/or through the substrate 101, which can be a substrate that will not be oxidized by the O₂ plasma (and/or any substrate 101 with a layer material on top that will not be oxidized by O₂ plasma). The transferred feature 107 is larger than the transferred feature 106, and both patterned features 106 and 107 can be tuned (with nanometer resolution) based on the plasma treatment process on the hardmask 102 (including both the non-oxidized and oxidized materials 102a and 102b).

Further with regard to the plasma treatment process, pore oxidation can be done by low temperature oxidation methods such as plasma-assisted oxidation, plasma-enhanced oxidation, and/or high pressure oxidation (HiPDX), which will be compatible with more materials than other high temperature oxidation methods. HiPDX is a low-temperature oxidation method that can be employed at temperatures as low as 500° C. in, for example, a high-pressure atmosphere consisting of about 5 atmospheres to about 30 atmospheres of oxygen with a trace amount of water vapor. A variety of low-temperature plasma-assisted oxidation processes have been described in a review by D. W. Hess in "Plasma-assisted oxidation, anodization, and nitridation of silicon" (IBM J. Res. Develop. Vol. 43 No. 1/2 January/March 1999), which is herein incorporated by reference. These plasma-assisted oxidation processes include microwave, radio frequency (RF), and direct current (DC) plasmas with a variety of reactor configurations (e.g., the sample to be oxidized may be directly exposed to the plasma and/or situated downstream from the plasma) and plasma densities. High density plasmas include electron cyclotron resonance and helical resonator discharges.

Another example of a plasma oxidation treatment process is one performed at substrate temperatures of 200-450° C. in a Tokyo Electron Limited (TEL) Trias™ SPA (slot plane antenna) tool that produces high-density plasmas at low electron temperatures. The TEL Trias™ SPA is a plasma processing system capable of, e.g., high-speed radical oxidation processing for 200 mm and 300 mm wafers.

Further with regard to the oxidizing ambient, these oxidation methods may be effected in a variety of ambients containing oxygen in some form. An ambient containing oxygen in some form may include oxygen-containing molecules (such as, e.g., $O_2$, $O_3$, NO, $NO_2$, $N_2O$, $H_2O$), mixtures of oxygen-containing molecules with gases and/or vapors that do not contain oxygen (such as, e.g., Ar, He, $N_2$, $NH_3$, HCl, trichloroethylene, $H_2$, $Cl_2$), as well as excited species such as ions and radicals derived therefrom. Also, in certain exemplary embodiments, the hardmask 102 material could be amorphous silicon (a-Si) and the plasma could be argon/oxygen (Ar/$O_2$) based.

Figure 2:
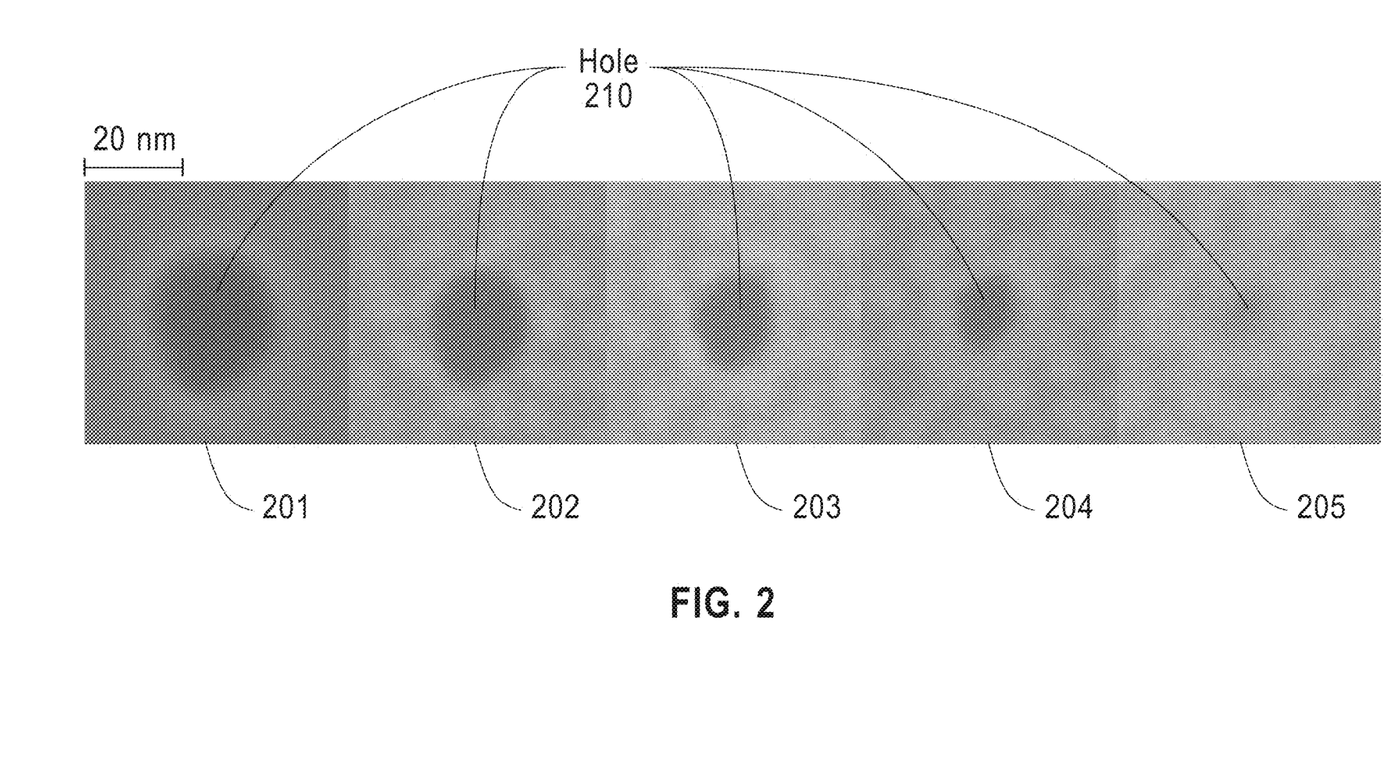
FIG. 2 illustrates an example of fine tuning holes utilizing the process of exemplary embodiments.

Now turning to FIG. 2, FIG. 2 illustrates an example of fine tuning holes utilizing the process of exemplary embodiments. Experiments were performed on holes 210 (such as the holes 103 in FIG. 1) in amorphous silicon (Si) (as the hardmask 102) under Ar/O2 based plasma (13.56 MHz, O2/Ar=1, 40 mTorr, 100 W at 400° C.) treatment. As illustrated in FIG. 2, view 201 is a scanning electron microscope (SEM) top view of a 25 nm hole 210 before plasma treatment. Views 202, 203, 204, 205 are SEM top views of the same hole 210 after plasma treatment for 25 minutes, 50 minutes, 75 minutes, and 100 minutes respectively. The original 25 nm hole 210 is finally shrunk down to less than 3 nm. It is understood that FIG. 2 is an example for illustration purposes and is not meant to be limiting.

FIGS. 3A-3D, block diagrams of cross section views, show an example of how the methods described above may be used to selectively tune feature sizes in two different layers of material, and how these methods may be employed to fabricate a device comprising one or more enclosed channels.

Figure 3A:
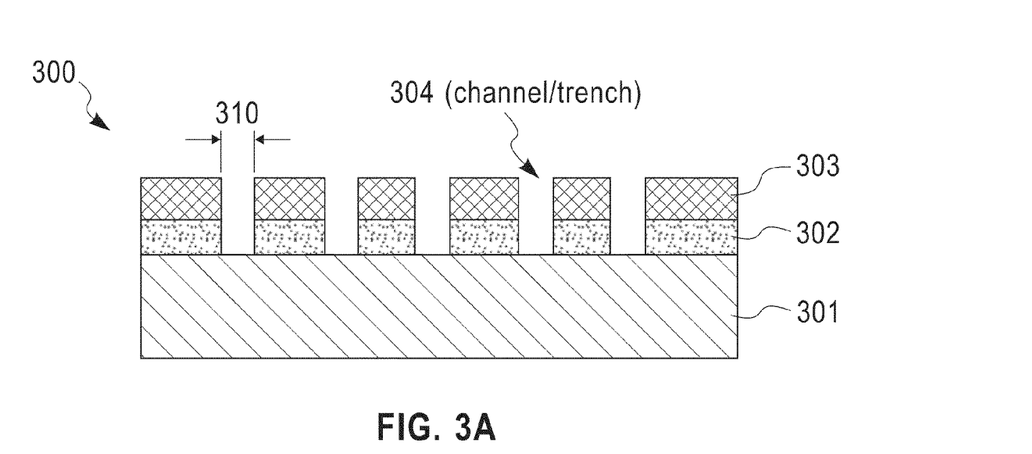
FIGS. 3A, 3B, 3C, and 3D illustrate a block diagram of a cross-section view of a layer stack in accordance with exemplary embodiments.

FIG. 3A shows layer stack 300 which includes a substrate 301, layer 302 and a hardmask layer 303. The layer 302 and hardmask layer 303 are made of different materials. The hardmask layer 303 is made of any material that can be oxidized by O₂ plasma during plasma treatment. The layer 302 can be made of any material that is either not oxidized by O₂ plasma and/or oxidized at a slower rate than the material of the hardmask layer 303. Substrate 301 desirably (but not necessarily) may comprise a material that is not oxidized by O2 plasma, but may alternatively comprise a layer that is oxidized by O2 plasma plus a top layer (not shown) that will not be oxidized by O2 plasma. An example of possible set of materials for layers 301, 302, and 303 is Al2O3 (or Al2O3-containing glass) for layer 301, SiN for layer 302, and a-Si for hardmask layer 303. As indicated above, a-Si is readily oxidized in O2 plasma whereas SiN is not. The usefulness (which is not a necessity) of a Al2O3-containing material for substrate 301 is it is a good etch stop for processes such as RIE in fluorine-containing ambients that might be used to etch a layer 302 of SiN.

Original features 304 (for example, trenches, channels, and/or holes) are formed in the layers 302 and 303 and may be formed via, e.g., a photolithography and/or sub-minimum-lithography method. The features 304 in the layer 302 and hard mask 303 may be formed utilizing a conventional method and/or utilizing techniques described in U.S. Pat. No. 7,351,648 entitled "Methods For Forming Uniform Lithographic Features" which is herein incorporated by reference.

Figure 3B:
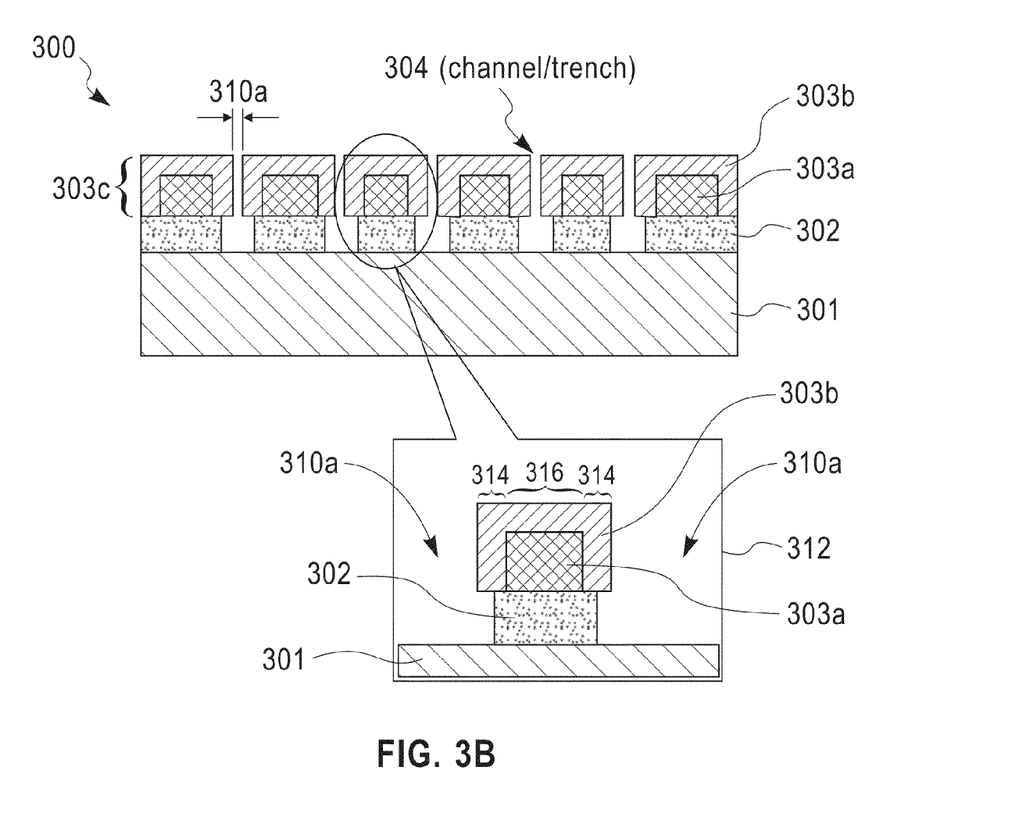

In FIG. 3B, when the plasma treatment process is applied (as discussed above), the features 304 in the hardmask layer 303 shrink much faster than in the layer 302 under the same plasma treatment. Additionally, if the layer 302 is a material that can not be oxidized during plasma treatment, then the features 304 through the layer 302 do not shrink at all (i.e., are not affected by the plasma treatment process). As discussed above with reference to FIG. 1, the plasma treatment process causes the hardmask layer 303 to grow oxidized material 303b (similar to the oxidized material 102b). The material of the hardmask layer 303 not oxidized in the layer stack 300 is referred to as non-oxidized material 303a (similar to the non-oxidized material 102a). For example, FIG. 3B shows a call out 312 which illustrates an enlarged view of a section of the non-oxidized and oxidized materials 303a and 303b. The width of the (as well as the height) of the hardmask layer 303 grows during plasma treatment. Width 316 represents the width of the non-oxidized material 303a, and the width 314 represents (the new growth of) oxidized material 303b that has grown as a result of the plasma treatment process. Repeated plasma treatments and/or prolonged plasma treatments can cause the width 314 of the oxidized material to continue growing until the sidewalls of the oxidized material 303b nearly touch and/or actually touch. Again, as the plasma treatment process is repeated and/or prolonged, a space 310 in FIG. 3A will shrink to 310a in FIG. 3B and continue to shrink until the space 310a between the sidewalls completely disappears as shown in FIG. 3C.

Figure 3C:
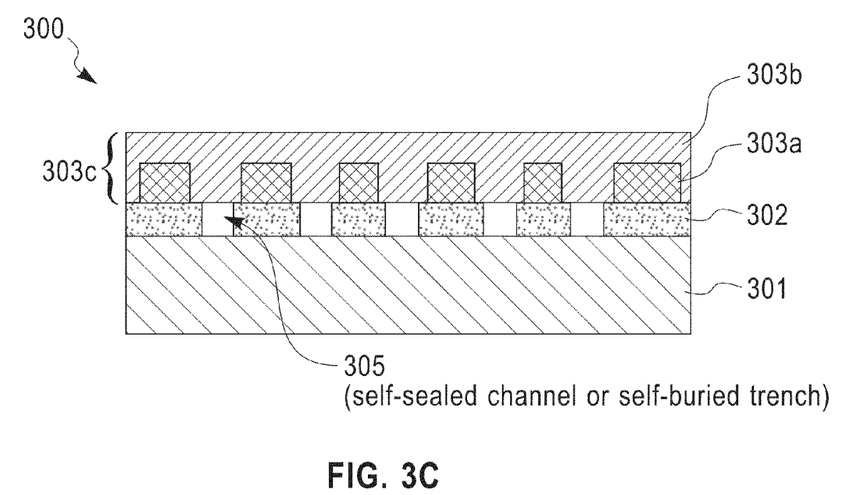

The combination of the non-oxidized material 303a and oxidized material 303b is referred to as hardmask 303c. In FIG. 3C, the top part of the feature 304 (e.g., trenches) in the hardmask layer 303c will close while the bottom part of the feature 304 in the layer 302 will remain open. This forms a self-sealed channel and/or self-buried trench (e.g., a micro and/or nano-fluidic channel) 305 in accordance with exemplary embodiments. That is, the feature 304 in the layer 302 is now sealed (on the top and bottom) in the layer stack 300, and self-sealed feature is referred to as self-sealed channel 305. Although the self-sealed channel 305 is illustrated for explanation purposes, it is understood that any type of feature can be sealed in accordance with exemplary embodiments.

Figure 3D:
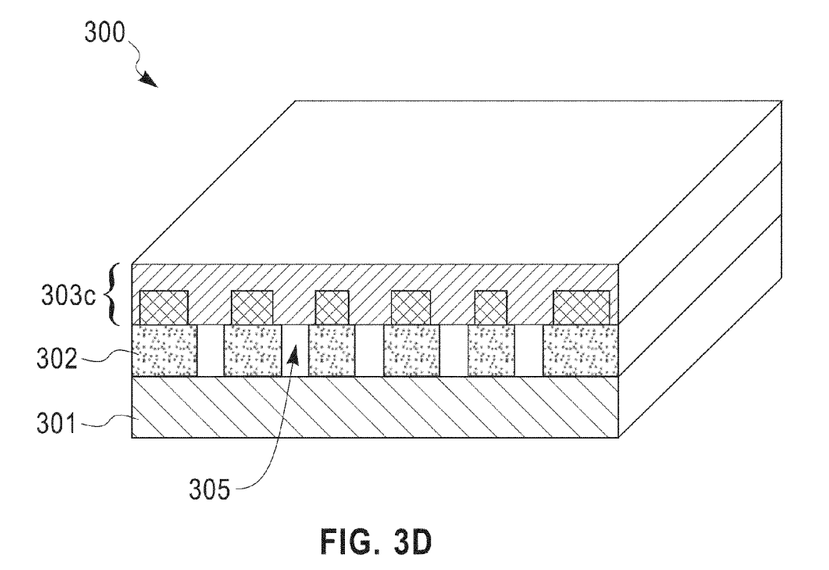

FIG. 3D represents a three-dimensional cross-section view of the layer stack 300 in accordance with exemplary embodiments. In FIG. 3D, the self-sealed channel 305 is shown with the closed hardmask layer 303c by utilizing the plasma treatment process as discussed herein. As mentioned above, the closed hardmask layer 303c comprises the non-oxidized material 303a and oxidized material 303b, which seals the channel 305.

Figure 4A:
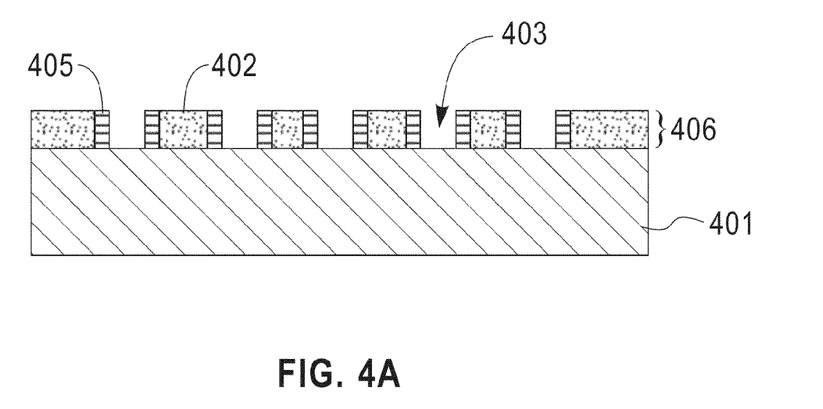
FIGS. 4A and 4B illustrate another implementation of exemplary embodiments.
Figure 4B:
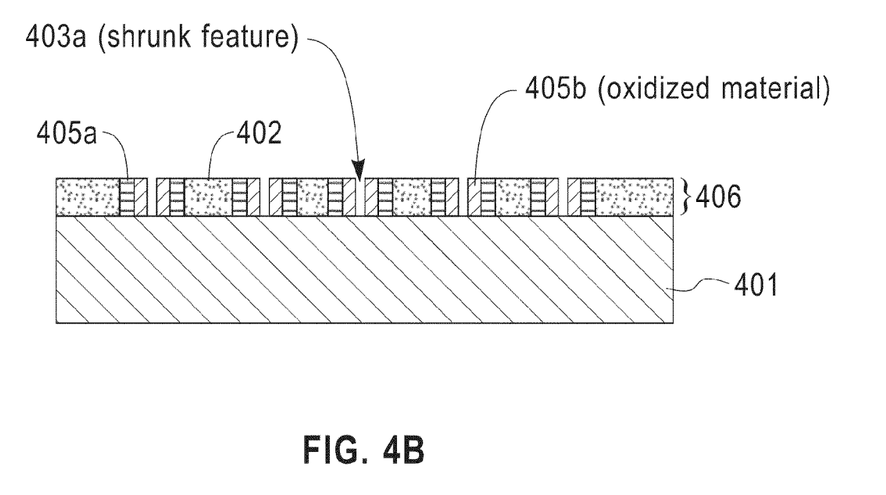

FIGS. 4A and 4B illustrate another implementation of exemplary embodiments. FIGS. 4A and 4B may be collectively referred to as FIG. 4. With regard to FIG. 1, it should be noted that patterned features 103 of the hardmask material 102 may comprise (i) a single homogeneous material that is oxidizable and/or (ii) a combination of materials in an arrangement which leaves oxidizable material on at least the sidewalls of the features 103 of the material 102 and non-oxidizable material in the remaining areas. An example in which material 102 comprises such a combination of materials is shown in FIG. 4. FIG. 4 illustrates an example of the homogeneous material 102 replaced by a structure that is a combination of oxidizable material (such as the material 102) and non-oxidizable material.

With reference to FIG. 4A, a layer stack 400 includes a hardmask 406 comprising material 402 that can not be oxidized by $O_2$ plasma during the plasma treatment process and material 405 that can be oxidized by $O_2$ plasma during the plasma treatment process. As seen in FIG. 4A, the material 405 is in the sidewalls of the material 402. For example, the oxidizable material 405 is in the sidewalls of the features 403. The oxidizable material 405 may form part of and/or the entire structure of the features 403. The features 403 can be any shape including holes, trenches, channels, pores, vias, etc.

FIG. 4B illustrates the layer stack 400 after the plasma treatment process in accordance with exemplary embodiments. In FIG. 4B, the features 403 have shrunk because of the (newly) grown oxide material 405b in the sidewalls of the material 402 (e.g., the features 403), and the shrunken features 403 are now illustrated as reduced in size features 403a. The oxidizable material 405 has been reduced in size because part of the oxidizable material 405 is utilized to grow the oxidized material 405b during the plasma treatment process, and the remaining oxidizable material 405 is illustrated as remaining material 405a. Although not shown, the pattern of smaller features 403a can be transferred to the substrate 401 (as discussed in FIG. 1), and the materials 402, 405a, and 405b can be removed leaving the patterned substrate 401 with the transferred copy of the smaller feature 403a.

Also, as discussed in FIG. 1, the oxidized material 405b can be removed thus leaving a larger feature 403a than the original feature 403, and the pattern of the enlarged feature 403a can be transferred to the substrate 101 (utilizing conventional techniques). Subsequently, the materials 402 and 405a can be removed leaving the patterned substrate 401 with the transferred copy of the enlarged feature 403a.

Figure 5:
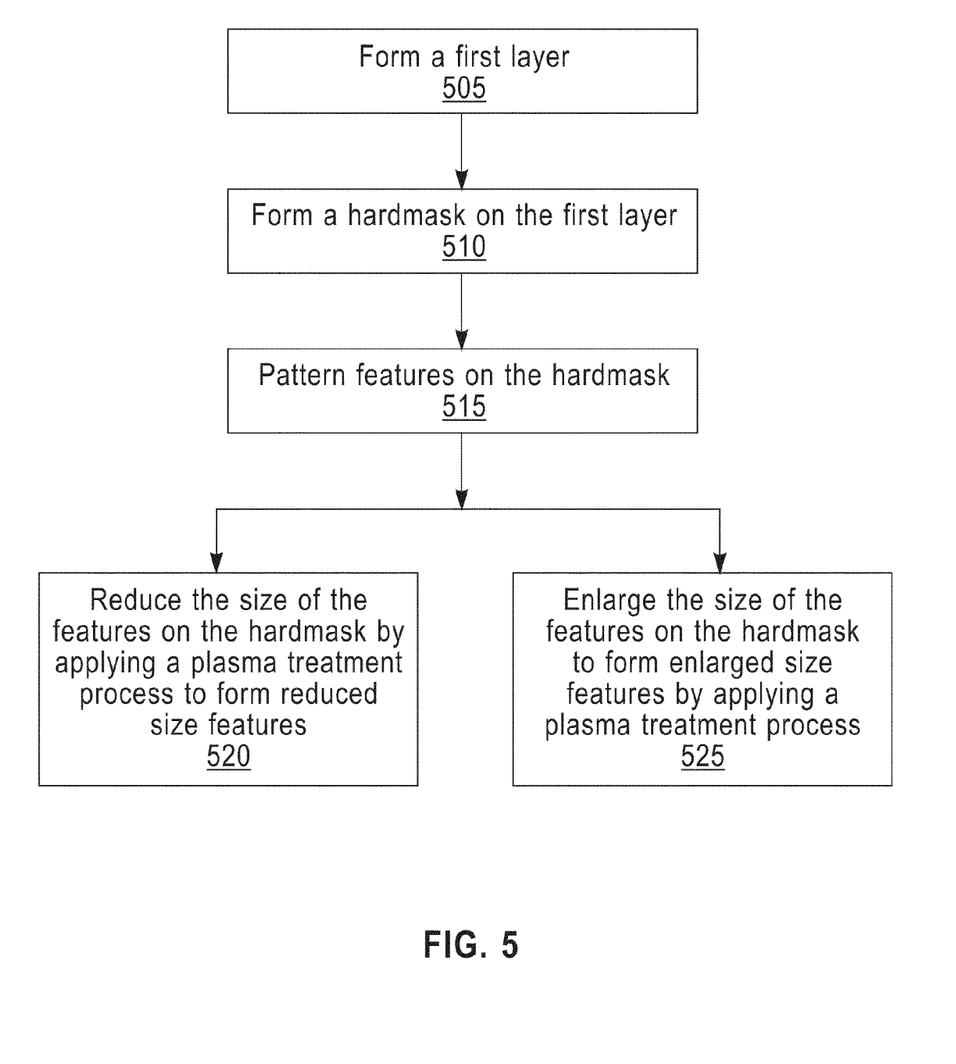
FIG. 5 illustrates a method for fabricating a device in accordance with exemplary embodiments.

FIG. 5 illustrates a method 500 for fabricating a device (such as the layer stack 100) in accordance with exemplary embodiments, and reference can be made to FIG. 1.

A first layer (such as the substrate 101) is formed at 505.
A hardmask (such as the hardmask 102) is formed on the first layer at 510.

Features (such as features 103) are patterned on the hardmask at 515. The features may be patterned on the hardmask, e.g., utilizing techniques described in U.S. Pat. No. 7,351,648 entitled "Methods For Forming Uniform Lithographic Features" and/or utilizing conventional patterning techniques.

The size of the features may be reduced on the hardmask (the hardmask 102 which includes the hardmasks 102a and 102b) by applying a plasma treatment process to form reduced size features (such as features 104) at 520.

On the other hand, the size of the features may be enlarged on the hardmask to form enlarged size features (such as the features 104a) by applying the plasma treatment process at 525.

Figure 6:
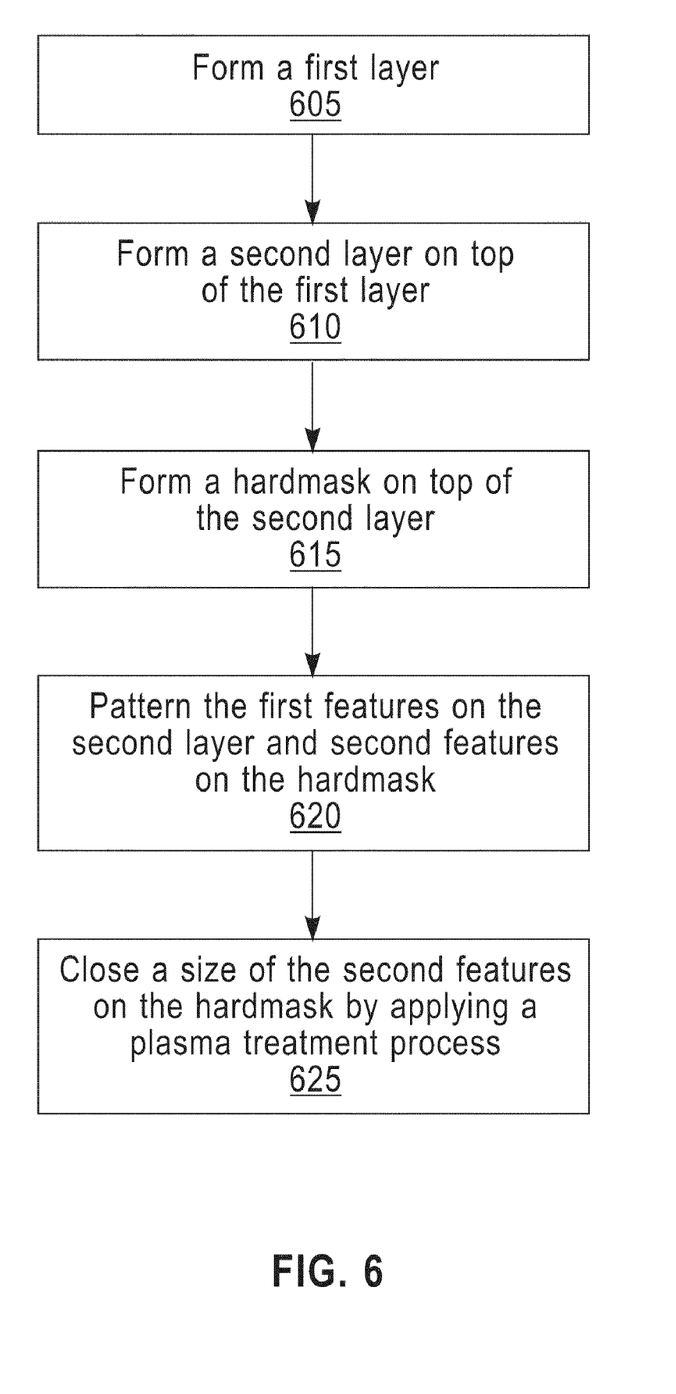
FIG. 6 illustrates a method for fabricating a device in accordance with exemplary embodiments.

FIG. 6 illustrates a method 600 for fabricating a device (such as the layer stack 300) in accordance with exemplary embodiments, and reference can be made to FIG. 3.

A first layer (such as the substrate 301) is formed at 605.
A second layer (such as the layer 302) is formed (deposited) on the first layer at 610.
A hardmask (such as the hardmask 303) is formed (deposited) on the second layer at 615.

The first features (such as features 304 in the layer 302) are patterned on the second layer and the second features (such as features 304 in the hardmask 303) are patterned on the hardmask at 620. For example, the layers 302 and 303 may be patterned in the same masking step for self-alignment, as understood by one skilled in the art. It is also noted that, in practice, the sequence of patterning steps would typically pattern the (top layer) hardmask 303 before patterning the (underneath) layer 302.

A size of the second features is closed (as seen in FIGS. 3B, 3C, and 3D) in the hardmask (hardmask 303c) by applying a plasma treatment process at 625.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a device, comprising:
    forming a first layer;
    forming a hardmask on the first layer, wherein the hardmask is configured to be oxidized by oxygen and the first layer is configured not to be oxidized by oxygen;
    patterning features on the hardmask, wherein the features comprise at least one of trenches, channels, holes, pores, and vias, wherein the features penetrate through the hardmask exposing the first layer without penetrating the first layer, such that the features form a first sidewall and a second sidewall having an inner distance there between in the hardmask; and
    reducing a size of the features in the hardmask by applying a plasma treatment process with oxygen to form reduced size features, wherein the reduced size features have an another inner distance between the first sidewall and the second sidewall, in which the another inner distance of the reduced size features is smaller than the inner distance of the features;
    wherein the plasma treatment process on the hardmask causes oxidized material to grow from the first sidewall and the second sidewall of the hardmask in order to reduce the inner distance there between, such that growing the oxidized material from the first sidewall and the second sidewall results in the another inner distance being smaller than the inner distance.

2. The method of claim 1, wherein a material of the first layer is different from a material of the hardmask.

3. The method of claim 1, wherein a material of the hardmask can be oxidized by the plasma treatment process.

4. The method of claim 1, wherein a material of the first layer can not be oxidized by the plasma treatment process.

5. The method of claim 1, further comprising transferring the reduced size features of the hardmask into the first layer such that transferred features in the first layer have the another inner distance of the reduced size features.

6. The method of claim 5, further comprising removing the hardmask.

7. The method of claim 1, wherein the reduced size features are formed by oxidization of the hardmask during the plasma treatment process.

8. The method of claim 1, wherein the plasma treatment process causes:
    the oxidized material to grow from the first sidewall in a direction toward the second sidewall; and
    the oxidized material to grow from the second sidewall in an opposing direction toward the first sidewall.

9. The method of claim 1, wherein continuously or repeatedly applying the plasma treatment process causes the oxidized material to continue to grow from the first sidewall and the second sidewall of the hardmask and further reduces the another inner distance of the first sidewall and the second sidewall of the reduced size features; and
    wherein applying the plasma treatment process is configured to fine tune a size of the reduced size features by reducing the another inner distance;
    further comprising transferring the reduced size features into the first layer to have transferred features with the another inner distance.

10. The method of claim 1, wherein the hardmask comprises:
    a first material proximate to the features on the hardmask, wherein the first material can be oxidized by the plasma treatment process; and
    a second material that at least one of can not be oxidized by the plasma treatment and is oxidized at a slower rate than the first material.

11. The method of claim 1,
    wherein the reduced size features respectively correspond to the at least one of the trenches, the channels, the holes, the pores, and the vias.

12. A method for fabricating a device, comprising:
    forming a first layer;
    forming a hardmask on the first layer;
    patterning features in the hardmask in which the hardmask is made of an original material, wherein the features comprise at least one of trenches, channels, holes, pores, and vias, wherein the features penetrate through the hardmask exposing the first layer, such that the features form a first sidewall and a second sidewall having an inner distance there between in the original material of the hardmask;
    enlarging a size of the features on the hardmask to form enlarged size features by applying a plasma treatment process with oxygen wherein the enlarged size features have an another inner distance between the first sidewall and the second sidewall, in which the another inner distance of the enlarged size features is larger than the inner distance of the features, wherein enlarging the size of the features on the hardmask to form the enlarged size features comprises:
    in a first stage, causing the plasma treatment process on the hardmask to grow oxidized material from the first sidewall and the second sidewall of the hardmask in order to reduce the inner distance there between, such that growing the oxidized material from the first sidewall and the second sidewall results in a shrunk inner distance being smaller than the inner distance;

wherein the oxidized material uses part of the original material to grow, in response to reducing an amount of the part from the original material; and in a second stage, removing a combination of the oxidized material and the part of the original material from the first sidewall and the second sidewall to result in the enlarged size features having the another inner distance between the first sidewall and the second sidewall in the hardmask, the another inner distance between the first sidewall and the second sidewall is larger than the inner distance;

wherein the original material minus the amount of the part remains to form the enlarged size features; and transferring the enlarged features of the hardmask into the first layer such that transferred features in the first layer have the another inner distance of the enlarged size features in the hardmask.

13. The method of claim 12, wherein enlarging the size of the features on the hardmask to form enlarged size features by applying the plasma treatment process comprises:

applying the plasma treatment process to grow the oxidized material proximate to the features on the hardmask; and removing the oxidized material grown proximate to the features on the hardmask to form the enlarged size features.

14. The method of claim 13, wherein applying the plasma treatment process causes the part of the original material of the hardmask that is proximate to the features to be utilized to grow the oxidized material; and wherein removing the oxidized material grown proximate to the features causes the size of the features to be enlarged into the enlarged size features because the part of the original material proximate to the features is removed.

15. The method of claim 13, wherein continuously or repeatedly applying the plasma treatment process:

causes the oxidized material to continue to grow proximate to the features on the hardmask, and further enlarges the enlarged size features, when the oxidized material is removed.

16. The method of claim 12, wherein the enlarged features respectively correspond to the at least one of the trenches, the channels, the holes, the pores, and the vias.

17. A method for fabricating a device, comprising:
forming a first layer;
forming a second layer on the first layer;
forming a hardmask on the second layer;
patterning first features on the second layer and second features on the hardmask; and
closing a size of the second features on the hardmask by applying a plasma treatment process with oxygen without closing a size of the first features on the second layer;

wherein the second features penetrate through the hardmask, such that the second features form a first sidewall and a second sidewall having an inner distance there between in the hardmask;

wherein closing the size of the second features in the hardmask by applying the plasma treatment process with oxygen without reducing the size of the first features in the second layer comprises closing the inner distance between the first sidewall and the second sidewall of the hardmask by applying the plasma treatment process to:

cause oxidized material to grow from the first sidewall in a direction toward the second sidewall;

cause the oxidized material to grow from the second sidewall in an opposing direction toward the first sidewall until the first sidewall and the second sidewall meet to form a closure over the first features in the second layer; and form the closure over the first features without filling in the first features.

18. The method of claim 17, wherein closing the size of the second features on the hardmask by applying the plasma treatment process comprises:

applying the plasma treatment process to cause oxidized material to grow proximate to the second features on the hardmask;

wherein applying the plasma treatment process causes the oxidized material to shrink the size of the second features until the second features close.

19. The method of claim 17, wherein closing the size of the second features on the hardmask by applying the plasma treatment process causes the hardmask to seal the first features on the second layer.

20. The method of claim 17, wherein closing the size of the second features on the hardmask by applying the plasma treatment process forms a self-sealed device comprising the first layer, the second layer, and the hardmask; and wherein the first features on the second layer comprise at least one of trenches, channels, holes, pores, and vias.

21. The method of claim 17, wherein a material of the hardmask oxidizes during the plasma treatment process;

wherein a material of the second layer can not oxidize during the plasma treatment process or the material of the second layer oxidizes at a slower rate than the material of the hardmask during the plasma treatment process.

* * * * *